(12) United States Patent
Gao et al.

(10) Patent No.: US 7,151,277 B2
(45) Date of Patent: Dec. 19, 2006

(54) SELECTIVE ETCHING OF SILICON CARBIDE FILMS

(75) Inventors: Di Gao, Albany, CA (US); Roger T. Howe, Martinez, CA (US); Roya Maboudian, Orinda, CA (US)

(73) Assignee: The Regents of the University of California, Oakland, CA (US)

( * ) Notice: Subject to any disclaimer, the term of this patent is extended or adjusted under 35 U.S.C. 154(b) by 149 days.

(21) Appl. No.: 10/613,508

(22) Filed: Jul. 3, 2003

(65) Prior Publication Data

US 2005/0001276 A1    Jan. 6, 2005

(51) Int. Cl.
H01L 29/04    (2006.01)
H01L 29/76    (2006.01)
H01L 29/26    (2006.01)
H01L 31/12    (2006.01)
H01L 33/00    (2006.01)

(52) U.S. Cl. ............................. 257/51; 257/67; 257/72; 257/79

(58) Field of Classification Search ............... None
See application file for complete search history.

(56) References Cited

U.S. PATENT DOCUMENTS

| | | | |
|---|---|---|---|
| 5,336,365 A | 8/1994 | Goda et al. | |
| 5,571,374 A | 11/1996 | Thero et al. | |
| 5,911,864 A | 6/1999 | Eldridge | |
| 6,034,001 A | 3/2000 | Shor et al. | |
| 6,262,445 B1 | 7/2001 | Swanson et al. | |
| 6,514,378 B1 | 2/2003 | Ni et al. | |
| 6,515,303 B1 | 2/2003 | Ring | |
| 6,525,428 B1 | 2/2003 | Ngo et al. | |
| 6,555,476 B1 | 4/2003 | Olsen et al. | |

OTHER PUBLICATIONS

Cho et al., *Applied Physics Letters*, 76(6):739-741 (2000).
Delsol et al., *Microelectronic Engineering*, 50:75-80 (2000).
Di Gao et al., *Applied Physics Letters*, 82(11):1742-1744 (2003).
Fleischman et al., *J. Vac. Sci. Technol. B*, 16(2):536-539 (1998).
Huang et al., Solid-State Sensor, Actuator and Microsystems Workshop, Hilton Head Island, South Carolina, Jun. 2-6, 2002, pp. 368-369.
Hung et al., *Microelectronic Engineering*, 63:405-416 (2002).
Hung et al., *Solid-State Electronics*, 46:791-795 (2002).
Hwang et al., *J. Vac. Sci. Technol. B*, 29(6):2199-2205 (2002).
Khan et al., *Applied Physics Letters*, 75(15):2268-2270 (1999).
Kotzar et al., *Biomaterials*, 23:2737-2750 (2002).
Lanois et al., *Journal of Electronic Materials*, 28(3):219-224 (1999).

(Continued)

*Primary Examiner*—David E. Graybill
(74) *Attorney, Agent, or Firm*—Townsend and Townsend and Crew LLP; Babak Kusha (57) ABSTRACT

A method of etching silicon carbide using a nonmetallic mask layer. The method includes providing a silicon carbide substrate; forming a non-metallic mask layer by applying a layer of material on the substrate; patterning the mask layer to expose underlying areas of the substrate; and etching the underlying areas of the substrate with a plasma at a first rate, while etching the mask layer at a rate lower than the first rate.

28 Claims, 5 Drawing Sheets

OTHER PUBLICATIONS

Lishan et al., "InP Processing Using an HBr High Density ICP Plasma," 4 pages (2001).
London et al., *Journal of Propulsion and Power*, 17(4):780-787 (2001).
Mehregany et al., *International Materials Reviews*, 45(3):85-107 (2000).
Okojie et al., *Sensors and Actuators A*, 66:200-204 (1998).
Sarro, *Sensors and Actuators*, 82:210-218 (2000).
Stoldt et al., *Applied Physics Letters*, 79(3):347-349 (2001).
Stoldt et al., *Sensors and Actuators A*, 97-98:410-415 (2002).
Tanaka et al., *J. Vac. Sci. Technol. B*, 19(6):2173-2176 (2001).
Tanaka et al., *Journal of Microelectromechanical Systems*, 10(1):55-61 (2001).
Yang et al., *Applied Physics Letters*, 78(2):162-164 (2001).
Yih et al., *Phys. Stat Sol.. B*, 202:605-642 (1997).
Di Gao et al., *The 12th International Conference on Solid State Sensors, Actuators and Microsystems*, 2:1160-1163 (2003).
Lanois et al., *Applied Physics Letters*, 69(2):236-238 (1996).
Zhao et al., *Proceedings of the International Symposium on Plasma Processing*, 96(12):410-415 (1996).

SELECTIVE ETCHING OF SILICON CARBIDE FILMS

STATEMENT AS TO RIGHTS TO INVENTIONS MADE UNDER FEDERALLY SPONSORED RESEARCH OR DEVELOPMENT

This invention was made with Government support under Grant (Contract) No. N660010118967 awarded by DARPA, and Grant (Contract) No. 9782 awarded by the Department of Energy/Sandia National Laboratories. The Government has certain rights to this invention.

BACKGROUND OF THE INVENTION

The present invention relates to semiconductor processing methods, and in particular to processing techniques for silicon carbide semiconductors.

Silicon carbide (SiC) is well known as an attractive material for electronic devices operating at high temperatures and high power due to its large energy band gap and high breakdown field. SiC also possesses superior mechanical properties and chemical inertness which are of interest in fabricating microelectromechanical systems (MEMS) as well as nanoelectromechanical systems (NEMS) for applications in harsh environments; environments characterized by locations exposed to high temperature, strong radiation, intense vibration, and corrosive and abrasive media. As a consequence, SiC-based MEMS have found applications in, for example, high-temperature sensors and actuators and micromachined gas turbine engines. Furthermore, due to its high acoustic velocity (defined as the square root of a ratio of Young's modulus to mass density $[E/\rho]$) and extremely stable surfaces, SiC is recognized as a promising structural material for fabricating ultra-high frequency micromechanical signal processing systems. The highly stable physico-chemical properties of SiC also improve the performance of high-frequency resonators as the surface-to-volume ratio increases when the resonator frequency scales into the GHz ranges. In addition, SiC has been found to be a biocompatible material.

One of the challenges in fabricating SiC devices is related to the selective etching of SiC films or SiC bulk materials. Unlike silicon ("Si"), SiC is not etched significantly by most acids and bases at temperatures less than 600° C., which makes wet etching of SiC a difficult task to accomplish. Non-standard techniques such as laser-assisted photoelectrochemical etching of SiC have been developed, but they require special equipment and have poor control over the lateral dimensions. Reactive ion etching ("RIE") is a known technology for patterning semiconductor devices with precise line-width control. Line-width control is a consideration when the device features are in sub-micron scales. Consequently, the RIE of SiC has been utilizing various fluorinated gases such as $CHF_3$, $CF_4$, $SF_6$, and $NF_3$ in combination with oxygen ("$O_2$"). Using these etch chemistries, the etch rate of SiC is slower than that of Si and silicon dioxide ("$SiO_2$"), due to several factors, including the strong bond between Si and C atoms. Moreover, using these etch chemistries, conventional etch masks for RIE such as hard-baked photoresist, silicon dioxide ("$SiO_2$"), and silicon nitride ("$Si_3N_4$") are etched at higher rates than SiC, which necessitates the employment of metals as etch masks. However, metal masks in RIE are known to cause micromasking phenomena, where metal atoms of the mask material are sputtered by the plasma and deposited in the etch field, producing grass-like structures, which are undesirable. In addition, metal masks in RIE result in contamination of the substrate in subsequent fabrication steps, as well as the microfabrication tools, and hence, are commonly prohibited in integrated circuit (IC) processing.

High-density plasmas have been investigated for SiC RIE to increase the etch rate and improve the etch profile. Such plasmas are generated at low pressures, and have low plasma potential but high ionization efficiencies. The process allows independent controls of ion energy and density. High density plasmas are also able to provide sufficient plasma densities to etch sub-micron features while reducing the surface damage. High-density plasma systems such as electron cyclotron resonance, inductively coupled plasma, including decoupled plasma sources and transformer coupled plasmas have been applied using fluorinated chemistry to achieve high SiC etch rates. However, metal masks are still employed when using these etch plasma chemistries.

There is therefore a need for a high-selectivity etching process using nonmetallic masks for SiC device fabrications.

BRIEF SUMMARY OF THE INVENTION

The present invention is directed at methods of etching silicon carbide using a nonmetallic mask layer. In one embodiment, the method includes: providing a silicon carbide substrate; forming a non-metallic mask layer by applying a layer of material on the substrate; patterning the mask layer to expose underlying areas of the substrate; and etching the underlying areas of the substrate with a plasma at a first rate, while etching the mask layer at a rate lower than the first rate.

In a specific embodiment, the nonmetallic mask layer may be a layer of silicon dioxide or a layer of silicon nitride.

In another embodiment, the etching of the silicon carbide layer is achieved using a hydrogen bromide etch chemistry. The use of hydrogen bromide etch chemistry, an unlikely chemistry for etching SiC allows for the use of non-metallic films as mask layers for the etching of SiC layers.

For a further understanding of the nature and advantages of the invention, reference should be made to the following description taken in conjunction with the accompanying drawings.

DETAILED DESCRIPTION OF THE INVENTION

Embodiments of the present invention are directed towards methods for etching SiC with a highly selective RIE process using a non-metallic mask layer. In certain embodiments, instead of using fluorinated gases, etching is performed using a hydrogen and bromine etch chemistry. This allows the use of non-metallic material such as silicon dioxide to mask a SiC substrate during the etch. In one aspect, the etching is performed using a hydrogen bromide ("HBr") etch chemistry in a plasma chamber. An HBr etch chemistry has been used to etch silicon, but not silicon dioxide, silicon nitride or SiC. Conventional wisdom of those skilled in the art would teach away from using HBr to etch SiC, since SiC is a very stable material. In addition, it is generally expected that silicon dioxide or silicon nitride would etch at a faster rate than SiC. Because of this, HBr would not ordinarily be considered as an effective etchant against a stable material such as SiC. The present invention, however, has demonstrated that under certain conditions HBr can be employed to etch SiC. In one embodiment, the etching is performed using an HBr etch chemistry in a plasma chamber configured to produce a high density plasma. As used herein, a high density plasma ("HDP") source is a plasma source where it is possible to control the average ion bombarding energy independently of the ion flux. This is made possible in a variety of electrodeless, low pressure (e.g. ~0.5–100 mTorr), high density (e.g., ~$10^{10}$–$10^{13}$ [cm$^{-3}$]) plasma sources. Among these plasma sources, there are four that remotely apply radiofrequency ("RF") or microwave energy to the plasma through a dielectric window. That is, instead of direct connection to an electrode in the plasma, as in RF diodes, these plasma sources use an external coil or antenna to direct the energy. For this reason, HDP plasma sources are commonly referred to as electrodeless or remote excitation sources. These four types of plasma sources include: 1) the electron-cyclotron-resonance ("ECR") sources; 2) helicon sources; 3) inductively-coupled plasma ("ICP") or transformer coupled plasma ("TCP") sources; and 4) helical-resonator sources. In addition, as used herein, inductively coupled plasma sources are created by the application of RF power to a non-resonant inductive coil. The various ICP chambers have different RF coil configurations to arrange a reasonably uniform plasma over a large area. Commercially available ICP plasma sources include the transformer coupled plasma (TCP™) and decoupled plasma sources (DPS™).

In accordance with the embodiments of the present invention, the nonmetallic mask layer that is used for etching SiC includes standard semiconductor processing materials, such as, $SiO_2$ and $Si_3N_4$. As is known, SiC is a compound of silicon (Si) and carbon (C), and takes many crystal forms known as polytypes with the same chemical composition. Common polytypes include the 3C, 2H, 4H, and the 6H polytypes. The 3C—SiC is referred to as the beta-SiC. There are more than several hundred polytypes reported. The 3C type is less commercially available, but has the highest electron mobility of all SiC polytypes. While the etching methods in accordance with the embodiments of the present invention are equally applicable to all SiC polytypes, as well as bulk SiC, in the examples described herein, a polycrystalline 3C—SiC film was etched.

Figure 1:
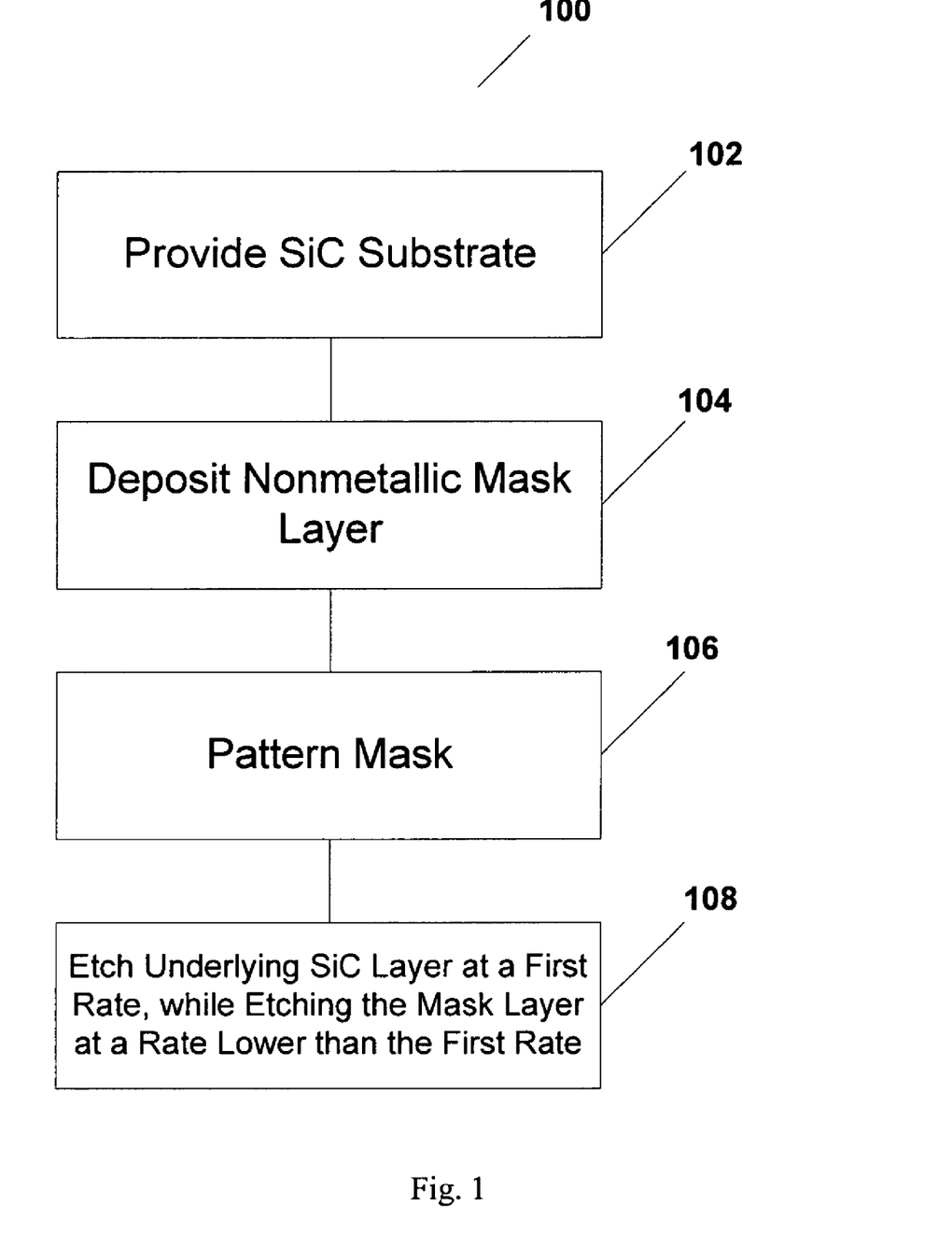
FIG. 1 is a flow chart of a portion of the SiC etching method in accordance with an embodiment of the present invention.

FIG. 1 is a flow chart 100 of a portion of the SiC etching method in accordance with embodiments of the present invention. First, a SiC substrate is provided (102). The substrate may either be a SiC substrate or a substrate having a layer of SiC formed thereon. Next, a non-metallic mask layer is deposited on the SiC substrate (104). The nonmetallic mask layer includes standard semiconductor processing materials, such as, silicon dioxide ($SiO_2$) and silicon nitride ($Si_3N_4$). Next, the mask layer is patterned using a hard baked photoresist layer, to expose underlying areas of the SiC substrate (106). This is followed by etching the underlying areas of the substrate with a plasma at a first rate, while etching the mask layer at a rate lower than the first rate (108). In one embodiment, the etching is achieved using a hydrogen bromide (HBr) etch chemistry.

The examples disclosed below etch a SiC substrate using the method of FIG. 1 above. In one series of examples, the selective etching of a SiC film starts with a 3C—SiC substrate. The non-metallic mask layers were deposited as follows. The $SiO_2$ films were deposited using $SiH_4$ and $O_2$ gases at 450° C., and the $Si_3N_4$ films were deposited using $NH_3$ and $SiH_2Cl_2$ gases at 835° C. Both of these nonmetallic mask layers were deposited using a commercially available Tylan™ low pressure chemical vapor deposition ("LPCVD") furnace. It should be apparent to those skilled in th art that other chambers as well as other process parameters may be used to deposit the $SiO_2$ and the $Si_3N_4$ films. The thickness of the deposited mask layer depends on the thickness of the SiC layer that is to be etched. The maximum thickness of the $SiO_2$ mask that can be deposited before it cracks depends on the oxide deposition method, which could be a low pressure chemical vapor deposition (LPCVD), a plasma enhanced chemical vapor deposition (PECVD), or others. To measure the etch rates, poly-SiC, $SiO_2$ and $Si_3N_4$ films are all deposited on Si substrates. In the exemplary embodiment, etch fields of 2 μm lines were patterned using $SiO_2$ masks for SiC and hard baked photoresist for $SiO_2$ and $Si_3N_4$. The etch rates were then calculated from the step heights of etched lines after removing the masks. The SiC etching was performed in a commercial LAM TCP™ 9400 system, configured to practice the embodiments of the present invention. The HBr flow rate and TCP bias power were kept constant at 100 standard cubic centimeters per minute ("sccm") and 150 W during all the etching examples. The range of RF power settings over which the exemplary etching method may be carried out are as follows: source power between 200 and 500 watts; bias power between 50 and 250 watts. Using these parameters, etch rates of SiC and mask materials were measured as functions of chamber pressure at different plasma chamber source power settings. High etch rate ratios of SiC/$SiO_2$ and SiC/$Si_3N_4$ up to 20:1 and 22:1 were achieved, which are the highest reported to date.

Figure 2A:
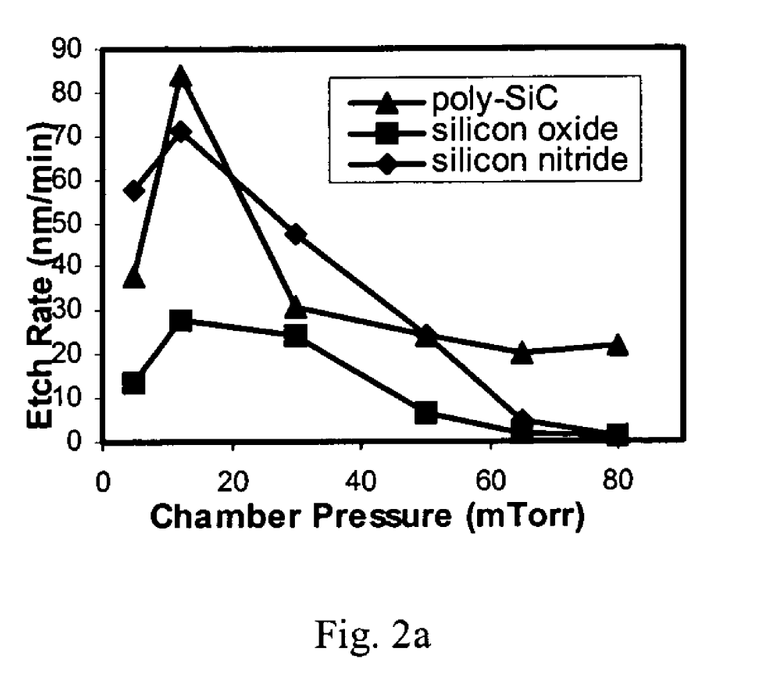
FIGS. 2a–b are graphs showing exemplary etch rates for poly-SiC, $SiO_2$, and $Si_3N_4$ in HBr plasma as a function of source power and chamber pressure.
Figure 2B:
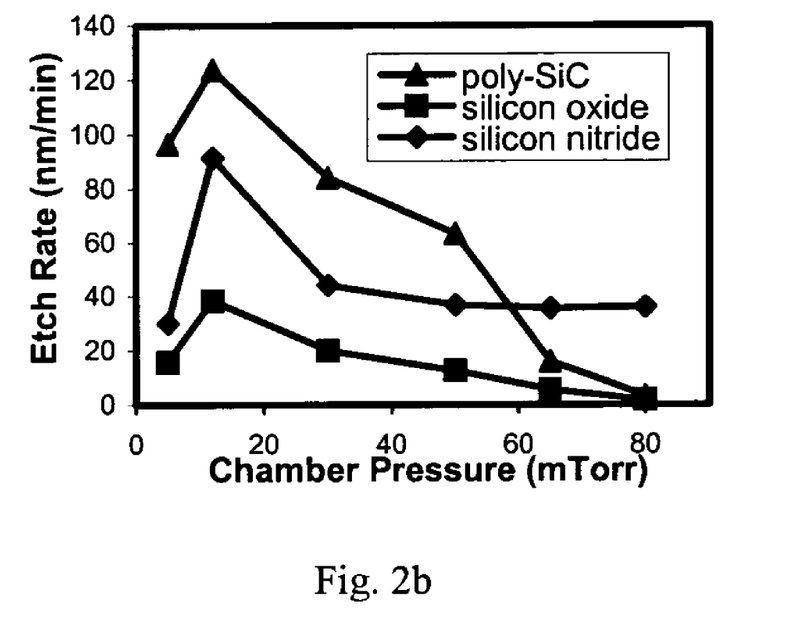
Figure 3A:
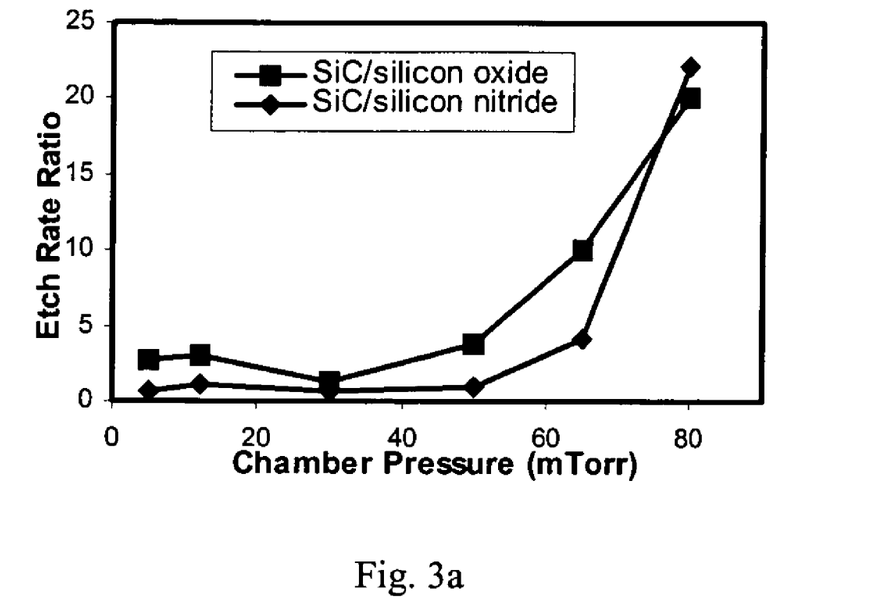
FIGS. 3a–b are graphs showing exemplary etch rate ratios of SiC/$SiO_2$ and SiC/$Si_3N_4$ as a function of source power and chamber pressure.
Figure 3B:
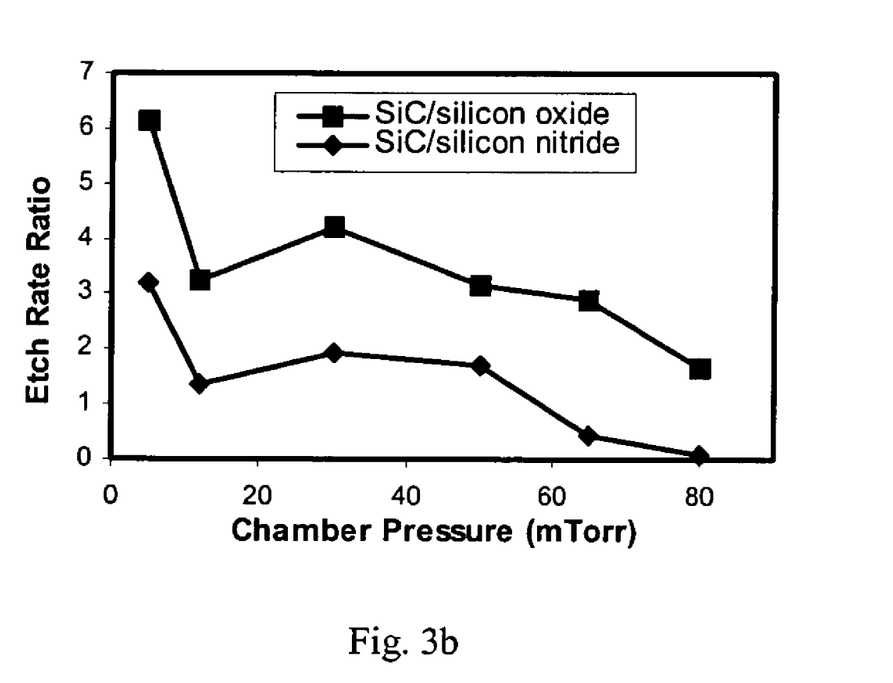

FIGS. 2a and 2b show the etch rates of poly-SiC, $SiO_2$, and $Si_3N_4$ in HBr plasma as a function of the chamber pressure while setting the TCP source power to 200 and 300 W, respectively. The etch rate ratios of SiC to $SiO_2$ and Si3N4 are plotted in FIGS. 3a and 3b for 200 and 300 W source powers respectively. For both of the source power settings, when the chamber pressure is increased from 5 to 80 mTorr, the etch rates of all three materials first increases (pressure<12 mTorr), and then decreases. The etch rate ratios of SiC to $SiO_2$ and to $Si_3N_4$ tend to increase as the pressure increases when the source power is 200 W, as is shown in FIG. 3a, but decrease with the pressure when the source power is 300 W, as shown in FIG. 3b. In this example, the maximum etch rate of SiC (~120 nm/min) is reached at 12 mTorr and 300 W source power, and the highest etch rate ratio or selectivity (20:1 for SiC/$SiO_2$ and 22:1 for SiC/$Si_3N_4$) is achieved at 80 mTorr and 200 W source power.

Figure 4:
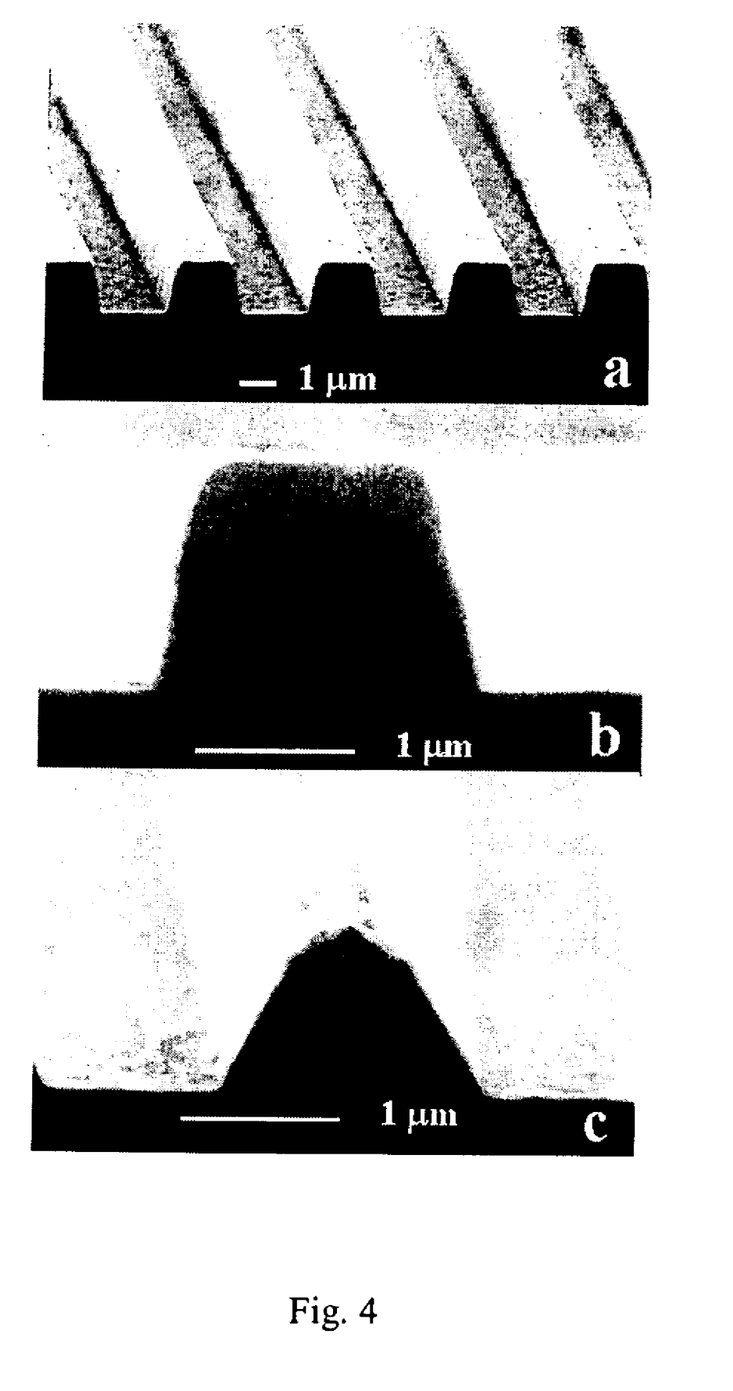
FIGS. 4a–c are SEM images of exemplary SiC etch profiles showing (a) 2 µm lines etched using embodiments of a high etch rate ratio condition; (b) a close-up of (a); and (c) 2 µm lines etched using embodiments of a high etch rate condition.

FIGS. 4a and 4b show scanning electron microscope ("SEM") profiles of exemplary 2 μm SiC lines etched according to the present invention, using the highest etch rate ratio condition (~80 mTorr and 200 W source power) before removing the SiO$_2$ mask. FIG. 4c shows the etch profile using the highest etch rate condition (~12 mTorr and 300 W source power). Comparing FIGS. 4b and 4c, the slope of the etched SiC sidewall increases as the etch rate ratio increases.

Figure 5:
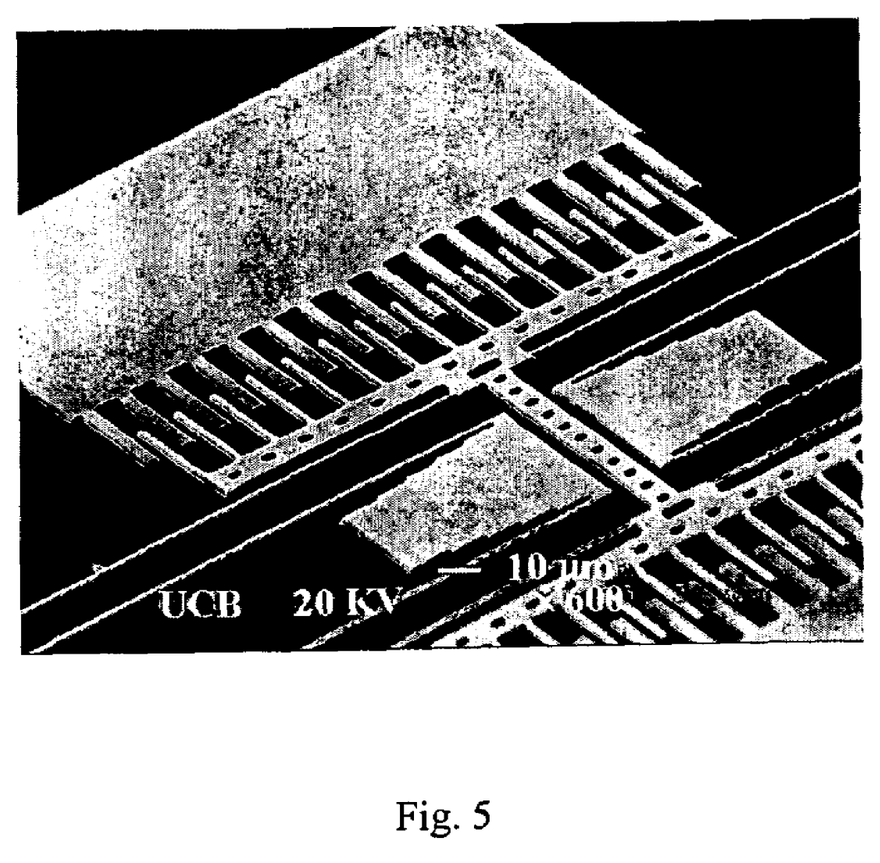
FIG. 5 is a SEM image of a polycrystalline SiC MEMS resonator fabricated using a SiC etch method in accordance with embodiments of the present invention.

As an example of an application for the etch process in accordance with embodiments of the present invention, a SiC micromechanical resonator is fabricated using a surface micromachining technology that incorporates this etch process. The process is briefly described by six steps: (i) deposition of Si$_3$N$_4$ isolation layer onto thermally oxidized Si substrates; (ii) growth of 0.5 μm doped polycrystalline Si films on top of Si$_3$N$_4$ as the conducting layer; (iii) deposition of 2 μm SiO$_2$ sacrificial layer; (iv) deposition of poly-SiC layer; (v) RIE of poly-SiC in HBr TCP using SiO$_2$ as the mask (e.g., at ~12 mTorr chamber pressure and 300 W source power); and (vi) release of the SiC resonators by time-etching the sacrificial SiO$_2$ layer in hydrofluoric acid ("HF"). FIG. 5 shows a SEM image of the resulting resonator.

In addition to the etch chemistries described above, alternative etch chemistries may be used to etch the SiC film using nonmetallic masks. These etch chemistries include the use of HBr and of chlorine (Cl$_2$) and/or small quantities of oxygen. The Cl$_2$ is preferably added at a ratio of 50 to 125 sccm of Cl$_2$ to 100 sccm of HBr. The addition of the Cl$_2$ gas can improve the etch rate of the SiC film. The oxygen is added in an amount approximately equivalent to 1% by flow rate or by weight with respect to the HBr gas and it can improve the etch selectivity of the SiC film with respect to its nonmetallic mask. In addition, argon gas may also be added to the HBr etch chemistry in an amount approximately equivalent to 1% by flow rate or by weight with respect to the HBr to improve the side wall profile of the etched SiC film.

As will be understood by those skilled in the art, the present invention may be embodied in other specific forms without departing from the essential characteristics thereof. For example, the SiC layer may be etched using any plasma chamber or any high density plasma chamber; the etching may be carried out using HBr or a combination of HBr and chlorine and/or oxygen gases. Furthermore, the nonmetallic mask layer may be deposited using any known and compatible technique. These other embodiments are intended to be included within the scope of the present invention, which is set forth in the following claims.

What is claimed is:

1. A method of etching silicon carbide, comprising:
   providing a silicon carbide substrate;
   forming a non-metallic mask layer by applying a layer of material on the substrate;
   patterning the mask layer to expose underlying areas of the substrate; and
   etching the underlying areas of the substrate with a plasma at a first rate, while etching the mask layer at a rate lower than the first rate.

2. The method of claim 1 wherein providing a silicon carbide substrate comprises providing a substrate having a layer of polycrystalline silicon carbide disposed thereon.

3. The method of claim 2 wherein providing a silicon carbide substrate comprises providing a substrate having a layer of polycrystalline 3C—SiC disposed thereon.

4. The method of claim 1 wherein forming a mask layer comprises applying a layer of silicon dioxide to the substrate.

5. The method of claim 4 wherein applying a layer of silicon dioxide comprises depositing the silicon dioxide layer using a low pressure chemical vapor deposition ("LPCVD") process.

6. The method of claim 5 wherein said LPCVD deposition process is carried out by using SiH$_4$ and O$_2$ gases at a temperature of approximately 450 Deg. C. in a LPCVD furnace.

7. The method of claim 1 wherein forming a mask layer comprises applying a layer of silicon nitride to the substrate.

8. The method of claim 7 wherein applying a layer of silicon nitride comprises depositing the silicon nitride layer using a low pressure chemical vapor deposition ("LPCVD") process.

9. The method of claim 8 wherein said LPCVD deposition process is carried out using NH$_3$ and SiH$_2$Cl$_2$ gases at a temperature of approximately 835 Deg. C. in a LPCVD furnace.

10. The method of claim 1 wherein patterning a mask layer comprises applying a photoresist layer to the mask layer and hard baking the photoresist layer.

11. The method of claim 1 wherein etching the underlying layer comprises using a non-fluorinated gas etch chemistry.

12. The method of claim 1 wherein etching the underlying layer comprises using a hydrogen and bromine etch chemistry.

13. The method of claim 1 wherein etching the underlying layer comprises using a hydrogen bromide etch chemistry.

14. The method of claim 13 further comprising using a chlorine etch chemistry.

15. The method of claim 14 wherein etching comprises flowing hydrogen bromide at a rate of approximately 100 standard cubic centimeters per minute (sccm) and flowing chlorine at a rate between 50 and 125 sccm into a plasma chamber.

16. The method of claim 13 further comprising using a chlorine and oxygen etch chemistry.

17. The method of claim 1 wherein said etching comprises forming a high density plasma using hydrogen bromide etch chemistry, where a high density plasma is a plasma providing sufficient plasma densities to etch sub-micron features while reducing surface damage.

18. The method of claim 1 wherein said etching comprises forming a high density plasma using hydrogen bromide etch chemistry, where a high density plasma is a plasma having an ion density of $10^{10}$ to $10^{13}$ ions per cubic centimeters.

19. The method of claim 1 wherein said etching comprises forming a high density plasma using hydrogen bromide etch chemistry using an inductively coupled plasma source.

20. The method of claim 19 wherein said forming comprises flowing said hydrogen bromide gas at a flow rate of approximately 100 standard cubic centimeters per minute in a chamber having a source power source and a bias power source.

21. The method of claim 20 comprising applying a source power between 200 and 500 watts, and applying a bias source power between 50 and 250 watts.

22. The method of claim 1 wherein said etching comprises removing the silicon carbide at a rate between 30 and 120 nm per minute.

23. The method of claim 1 wherein said etching comprises removing the silicon carbide at a rate of at least 100 nm per minute.

24. The method of claim 1 wherein said etching comprises removing the silicon carbide at an etch rate ratio between 1:1 and 20:1 with respect to a silicon dioxide mask layer.

25. The method of claim 1 wherein said etching comprises removing the silicon carbide at an etch rate ratio between 1:1 and 22:1 with respect to a silicon nitride mask layer.

26. A method of etching silicon carbide, comprising:
providing a silicon carbide substrate;
forming a non-metallic mask layer by applying a layer of material on the substrate;
patterning the mask layer to expose underlying areas of the substrate; and
etching the underlying areas of the substrate with a plasma using a hydrogen bromide etch chemistry at a first rate, while etching the mask layer at a rate lower than the first rate.

27. The method of claim 26 wherein forming a mask layer comprises applying a layer of silicon dioxide to the substrate.

28. The method of claim 26 wherein forming a mask layer comprises applying a layer of silicon nitride to the substrate.

* * * * *